(12) United States Patent
Gadau et al.

(10) Patent No.: US 7,742,294 B2
(45) Date of Patent: Jun. 22, 2010

(54) OVER-CENTER LATCH APPARATUS FOR A PORTABLE COMPUTING DEVICE

(75) Inventors: William Eugene Gadau, Spokane, WA (US); Neal Stanley Clark, Spokane, WA (US)

(73) Assignee: General Dynamics Itronix Corporation, Spokane Valley, WA (US)

( * ) Notice: Subject to any disclaimer, the term of this patent is extended or adjusted under 35 U.S.C. 154(b) by 23 days.

(21) Appl. No.: 12/100,033

(22) Filed: Apr. 9, 2008

(65) Prior Publication Data

US 2009/0256364 A1 Oct. 15, 2009

(51) Int. Cl.
*G06F 1/16* (2006.01)
*H05K 5/00* (2006.01)
*H05K 7/00* (2006.01)

(52) U.S. Cl. .............................. 361/679.43; 361/679.4; 361/679.41; 439/142

(58) Field of Classification Search ................. 361/683, 361/684, 679.02, 679.31, 679.4, 679.41, 361/679.55, 679.58, 679.43; 439/468, 142
See application file for complete search history.

(56) References Cited

U.S. PATENT DOCUMENTS

| | | | | |
|---|---|---|---|---|
| 4,381,063 A | * | 4/1983 | Leong | 439/133 |
| 5,198,966 A | | 3/1993 | Kobayashi et al. | |
| 5,199,888 A | * | 4/1993 | Condra et al. | 361/683 |
| 5,255,965 A | * | 10/1993 | Chen et al. | 312/7.1 |
| 5,331,506 A | * | 7/1994 | Nakajima | 361/683 |
| 5,574,625 A | * | 11/1996 | Ohgami et al. | 361/684 |
| 5,738,536 A | * | 4/1998 | Ohgami et al. | 361/683 |
| 5,924,782 A | * | 7/1999 | Park | 312/328 |
| 5,947,762 A | * | 9/1999 | Katsuma | 439/468 |
| 6,102,501 A | * | 8/2000 | Chen et al. | 361/679.58 |
| 6,201,688 B1 | | 3/2001 | Leman | |
| 6,267,608 B1 | * | 7/2001 | Yagi | 439/142 |
| 6,527,309 B1 | | 3/2003 | Gaydos et al. | |
| 6,570,757 B2 | | 5/2003 | DiFonzo et al. | |
| 6,595,608 B1 | * | 7/2003 | Minelli et al. | 312/296 |
| 6,674,639 B2 | * | 1/2004 | Wang et al. | 361/683 |
| 6,757,160 B2 | * | 6/2004 | Moore et al. | 361/683 |
| 6,845,005 B2 | | 1/2005 | Shimano et al. | |
| 6,919,510 B1 | * | 7/2005 | Chen | 174/66 |
| 6,967,832 B2 | * | 11/2005 | Mariano | 361/683 |
| 7,123,487 B2 | * | 10/2006 | Saito et al. | 361/726 |
| 7,307,846 B2 | * | 12/2007 | Du | 361/727 |
| 7,510,250 B2 | * | 3/2009 | Lin et al. | 312/223.2 |

(Continued)

*Primary Examiner*—Jayprakash N Gandhi
*Assistant Examiner*—Adrian S Wilson
(74) *Attorney, Agent, or Firm*—Hunton & Williams LLP

(57) ABSTRACT

A portable computing device, including a latch apparatus and system, may include a rotatable high wear plastic oversnapping arm, a pivot portion on the portable computing device, and an enclosure door with a geometric mating feature. The oversnapping arm may be configured to rotate 90° about the pivot portion to snap over the geometric mating feature and secure the enclosure door in a closed, latched position. As the oversnapping arm is rotated downward, its progress may be frictionally impeded by the geometric mating feature. Applying downward pressure on the oversnapping arm towards the physical interference may cause the oversnapping arm to bend over the interfering feature and snap into a closed, geometrically interlocked position. In the closed, latched position, the oversnapping arm may apply a positive pressure against the enclosure door. The positive pressure on the enclosure door increases the environmental sealing capabilities by putting additional pressure on the existing environmental seal.

14 Claims, 15 Drawing Sheets

U.S. PATENT DOCUMENTS

2002/0027771 A1* 3/2002 Dong .................. 361/683
2006/0245159 A1* 11/2006 Lin et al. ............... 361/685
2007/0201200 A1 8/2007 Schlesener et al.
2008/0024969 A1* 1/2008 Sun et al. .............. 361/683

* cited by examiner

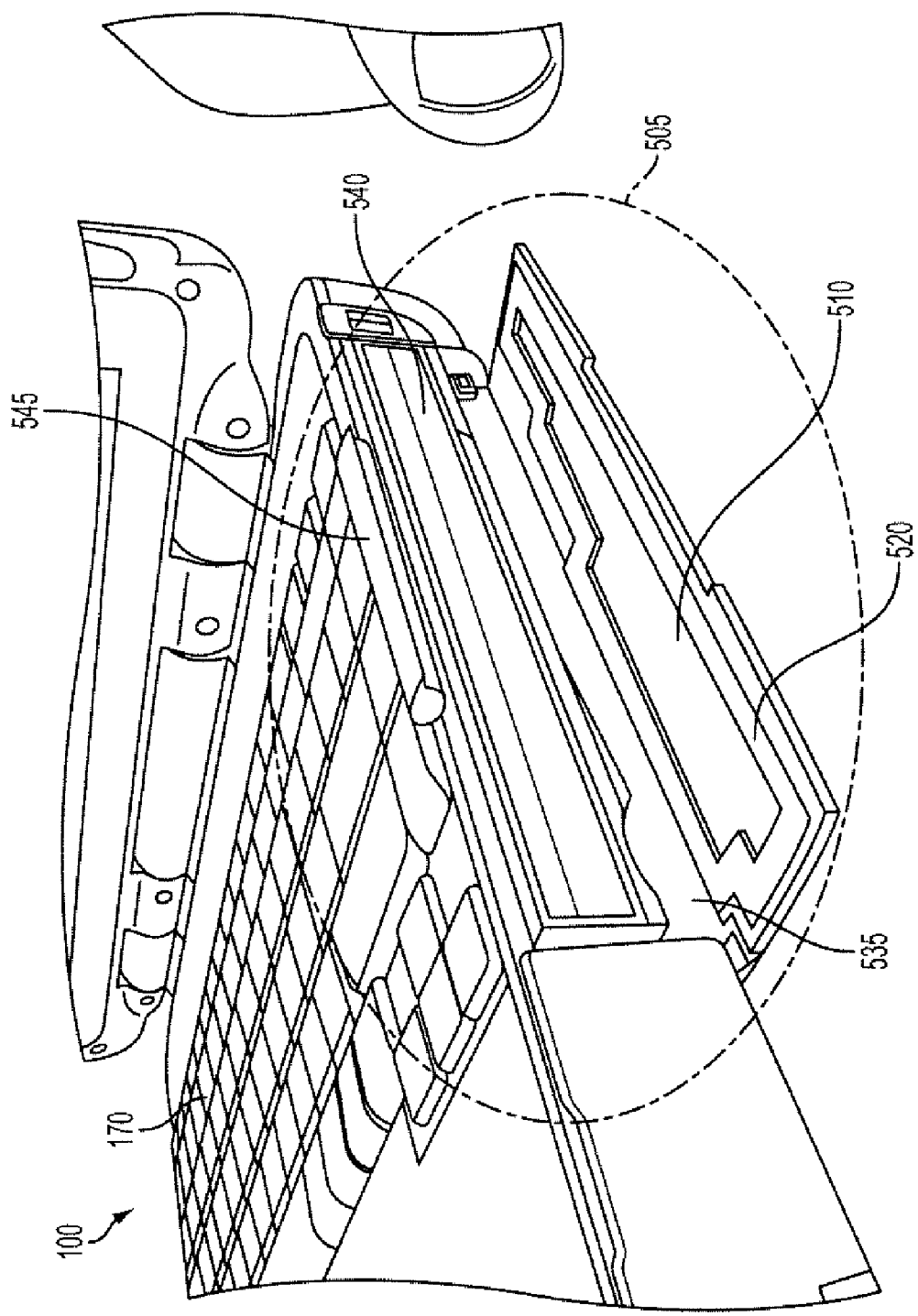

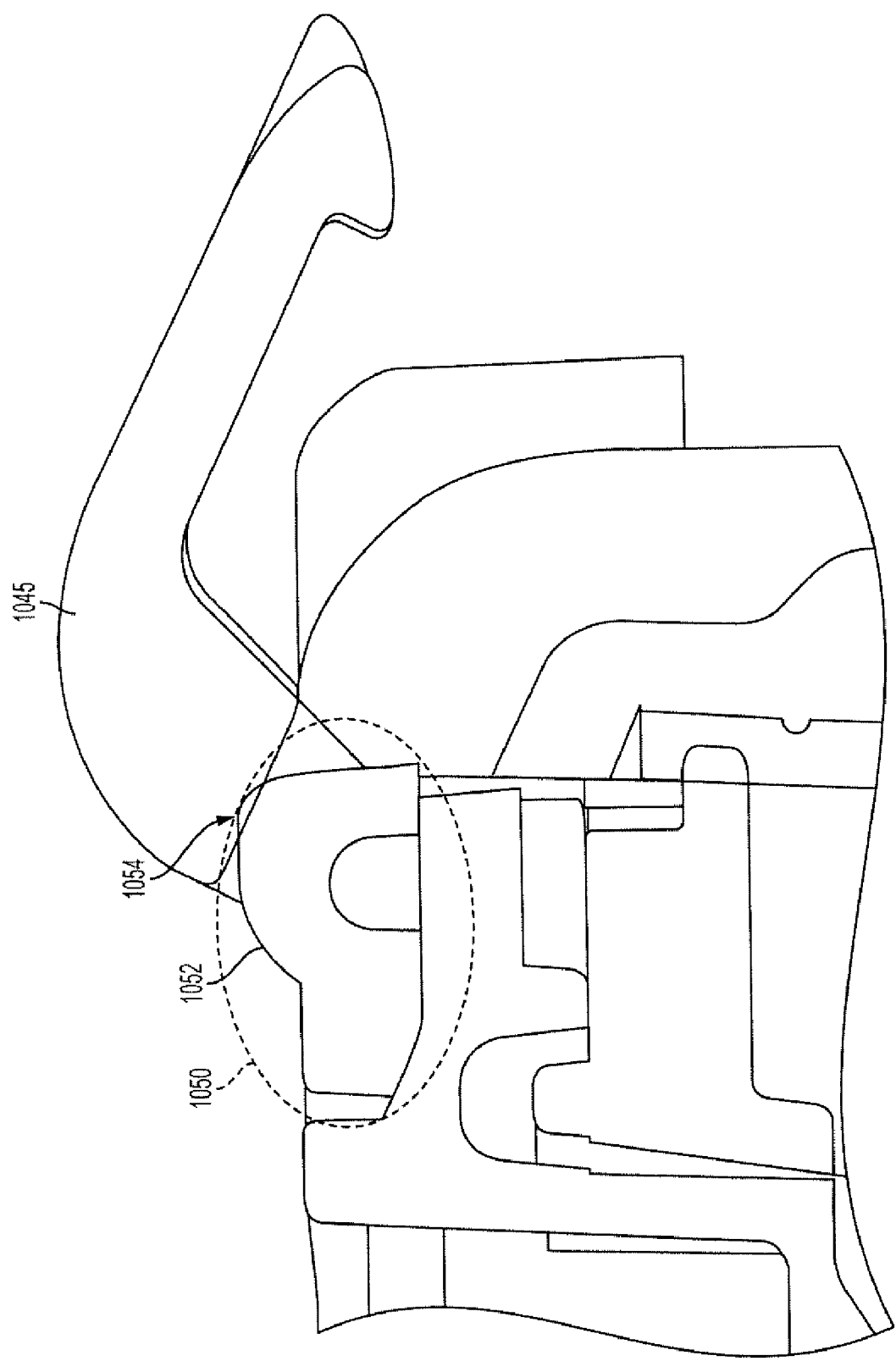

OVER-CENTER LATCH APPARATUS FOR A PORTABLE COMPUTING DEVICE

BACKGROUND INFORMATION

In recent years, decreased prices and increased processing capability have resulted in a dramatic increase in the use of portable computing devices. Personal and professional consumers alike are attracted to portable computing devices because, among other things, some are lightweight and mobile. With portable computing devices, users can perform computing tasks in various places outside the confines of a traditional workstation area.

BRIEF SUMMARY OF THE INVENTION

In one exemplary aspect, a latch apparatus for securing a door on a portable computing device is provided. The latch apparatus comprises an oversnapping arm configured to rotate about a pivot portion and an enclosure door comprising an inside surface, an outside surface, a geometric mating feature on the outside surface, and an enclosure sealer on the inside surface, wherein the geometric mating feature is configured to present a physical interference to the oversnapping arm when the oversnapping arm rotates in the direction of the enclosure door. The oversnapping arm is configured to elastically deform around the physically interfering geometric mating feature when sufficient force is applied to the oversnapping arm in the rotation direction toward the enclosure door. The oversnapping arm is deflected over the geometric mating feature and snaps into a stable, geometrically interlocked position with the geometric mating feature.

In another exemplary aspect, a portable computing device is provided. The device comprises a base unit comprising a processor, a display panel coupled to the base unit, an apparatus for securing a door, the door comprising a pivot portion coupled to the base unit of a portable computing device, an oversnapping arm configured to rotate about the pivot portion, and an enclosure door comprising an inside surface, an outside surface, a geometric mating feature on the outside surface and an enclosure sealer on the inside surface, wherein the geometric mating feature is configured to present a physical interference to the oversnapping arm when the oversnapping arm is rotated in the direction of the enclosure door. The oversnapping arm is configured to bend around the physically interfering geometric mating feature when sufficient force is applied to the oversnapping arm in the rotation direction toward the enclosure door. The oversnapping arm is deflected over the geometric mating feature and snaps into a stable, geometrically interlocked position with the geometric mating feature.

In another exemplary aspect, an apparatus for sealing a door on a portable computing device is provided. The apparatus comprises oversnapping means for snapping over an interfering feature, an arm interference means for deflecting the progress of a rotating arm, an enclosure sealer for creating a water and dust resistant seal around an enclosure, and a seal tightening means for applying positive pressure on the card enclosure sealer.

BRIEF DESCRIPTION OF THE DRAWINGS

Purposes and advantages of the exemplary embodiments will be apparent to those of ordinary skill in the art from the following detailed description in conjunction with the appended drawings in which like reference characters are used to indicate like elements. These drawings should not be construed as limiting the present disclosure, but are intended to be exemplary only.

FIG. 5 is a right side diagonal view of a portable computing device having a latch apparatus in an open position in accordance with exemplary embodiments;

FIG. 10(a) is a side view of an oversnapping arm in contact with a bump interference of a bracket in accordance with exemplary embodiments.

Figure 1:
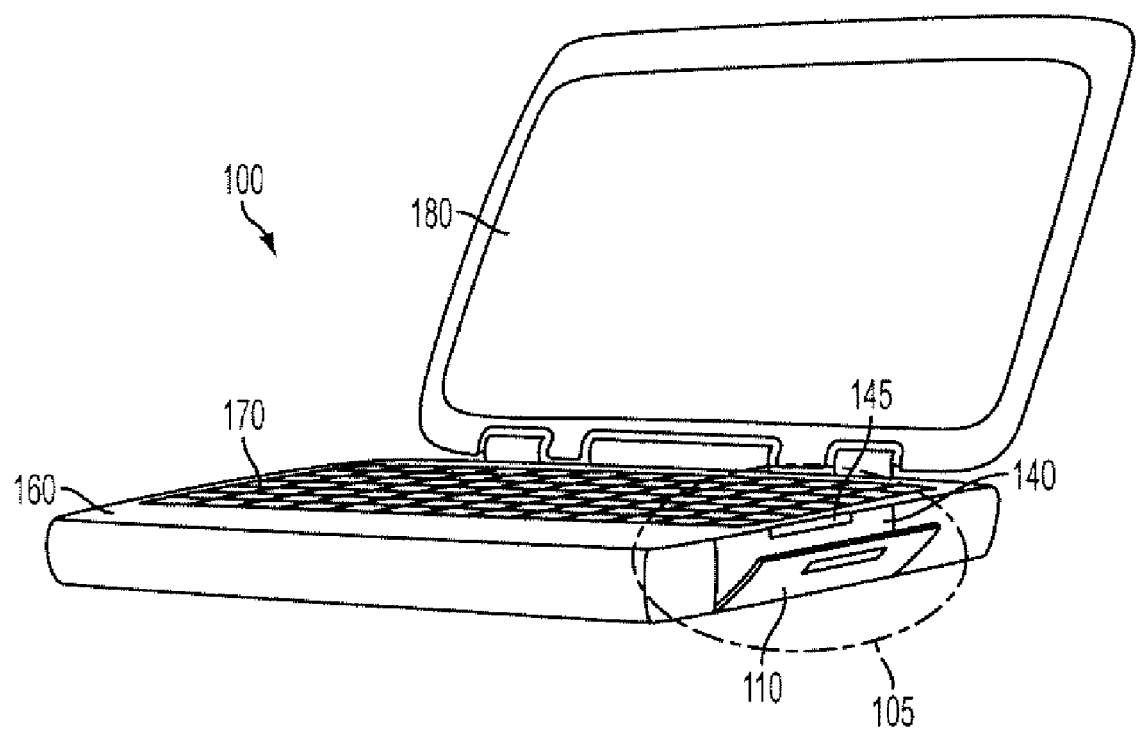
FIG. 1 is a right diagonal view of a portable computing device having a latch apparatus for securing a door in a closed position in accordance with exemplary embodiments.

Advantages of these and other embodiments will become apparent from the following detailed description, which taken in conjunction with the accompanying drawings, describe by way of example—and not limitation—principles of various exemplary embodiments.

DETAILED DESCRIPTION OF THE EXEMPLARY EMBODIMENTS

As usage of portable computing devices increases, so too does the need to protect the information stored on such devices. Consumers are realizing that important information could be jeopardized, for example, if their portable computing device is dropped or otherwise damaged. Thus, there is a need for more rugged portable computing devices. There also exists a need for portable computing devices that are rugged in the sense that they are resistant to damage from common environmental elements such as rain, dust, sand, and the like.

One way of keeping portable computing devices small and lightweight without sacrificing functionality is by allowing cards, disk drives, memory, batteries, or other peripheral devices to be swapped in and out of the device. Drives, cards, and other peripherals have conventionally been secured with latches that utilize a metal spring. Such spring latches have small moving parts and are thus subject to mechanical failures upon repeated use. This is especially problematic in an environment, such as a military environment, where latches may be opened and closed quite frequently. Furthermore, spring latches are susceptible to popping open when a portable computing device is dropped or otherwise physically jarred.

A portable computing device according to an embodiment of the present invention, including a latch apparatus and system, may further include a rotatable oversnapping arm made of high-wear plastic, an arm pivot portion on the portable computing device, and an enclosure door with an inside surface and an outside surface. The outside surface of the enclosure door may include a geometric mating feature for mating with an oversnapping arm. The inside surface of the enclosure door may include an enclosure sealing portion. The enclosure door may be configured to rotate about an enclosure door pivot portion. The enclosure door may be opened so that a peripheral device can be inserted and removed into an enclosure area in the portable computing device. The enclosure door may be rotated about an enclosure door pivot portion so that its inside surface presses against an enclosure area. The oversnapping arm may be rotated over top of the outside surface of the enclosure door securing the enclosure door against the enclosure by snapping over the geometric mating feature.

The oversnapping arm may be configured to rotate 90° about the pivot portion to snap over the geometric mating feature and secure the enclosure door in a closed, latched position. As the oversnapping arm is rotated downward, its progress may be impeded by the geometric mating feature. Applying pressure on the oversnapping arm in a direction towards the physical interference may cause the oversnapping arm to bend over the interfering feature and snap into a closed, geometrically interlocked position. In the closed position, the elasticity of the oversnapping arm may serve to apply positive pressure to the enclosure door, adding to existing environmental sealing capabilities.

When the oversnapping arm is pushed down onto the geometric mating feature, the arm itself may be deflected until it snaps back over the feature and into place. This is referred to as an "overcenter latch" because the force exerted on the oversnapping arm (as it is rotated in the direction of the geometric mating feature) produces a potential energy in the arm as it bends over the high point of the feature. This potential energy is released as the arm moves past the high point of the feature. Once the arm snaps into place, it is in a stable condition and would require work to remove it from that position. That is, the closed arm is in a potential energy well when in closed position. As a result, the latch apparatus may remain in a closed or locked position even after a jarring physical event.

When the latch is in a closed or locked position, the oversnapping arm may exert a positive force on the enclosure door which may increase the sealing effect of the enclosure door and result in the contents of the enclosure being shielded against water and dust. Additionally, the oversnapping arm may be made of a high-wear plastic material to ensure reliable and robust performance even after frequent use for many years. The latching apparatus may function without metallic springs.

The portable computing device may meet the United States Military standard for protection against water and dust (MIL STD 810F.). Further, the latch may be configured to remain in the locked or closed position even after a jarring physical event, such as a shock, drop, or vibration. The portable computing device may meet the United States Military standard for shocks, drops, and vibration (MIL STD 810F). The portable computing device may meet the United States Military standard for Water & Dust Ingress Protection (IEC 60529).

The latch apparatus may produce an audible sound when it snaps into a closed or locked position. The audible sound may allow the user to know that the latch is closed.

FIG. 1 is a right diagonal view of a portable computing device 100 having a latch apparatus for securing a door in a closed position in accordance with exemplary embodiments. The portable computing device 100 may include a base unit 160. Base unit 160 may include a processor, system memory, and a persistent storage device. The portable computing device 100 may also include a keyboard 170 coupled to the top surface of the base unit 160. The portable computing device 100 may also include a light emitting display panel 180.

The portable computing device 100 may also include a latch apparatus 105. Latch apparatus 105 may include an oversnapping arm 145. Exemplary materials for the oversnapping arm 145 include, by way of non-limiting example, a thermoplastic material, Nylon, Noryl, PPO, or Acetal. Latch apparatus 105 may also include an enclosure door 110. The enclosure door 110 may be formed of, by way of non-limiting example, an aluminum alloy, a magnesium alloy, or another metal alloy.

Enclosure door 110 may lie against and apply pressure to an enclosure area 140 in a portable computing device 100. The enclosure area 140 may be a slot or a hole in the base unit 160 of a portable computing device where different varieties of cards, disk and hard drives, batteries, or various other peripheral devices may be removably inserted. The enclosure area 140 may include an area for a disk drive to be opened and closed. The enclosure area 140 may also include an interface for various input/output connections, networking connections, or external storage connections.

Figure 2:
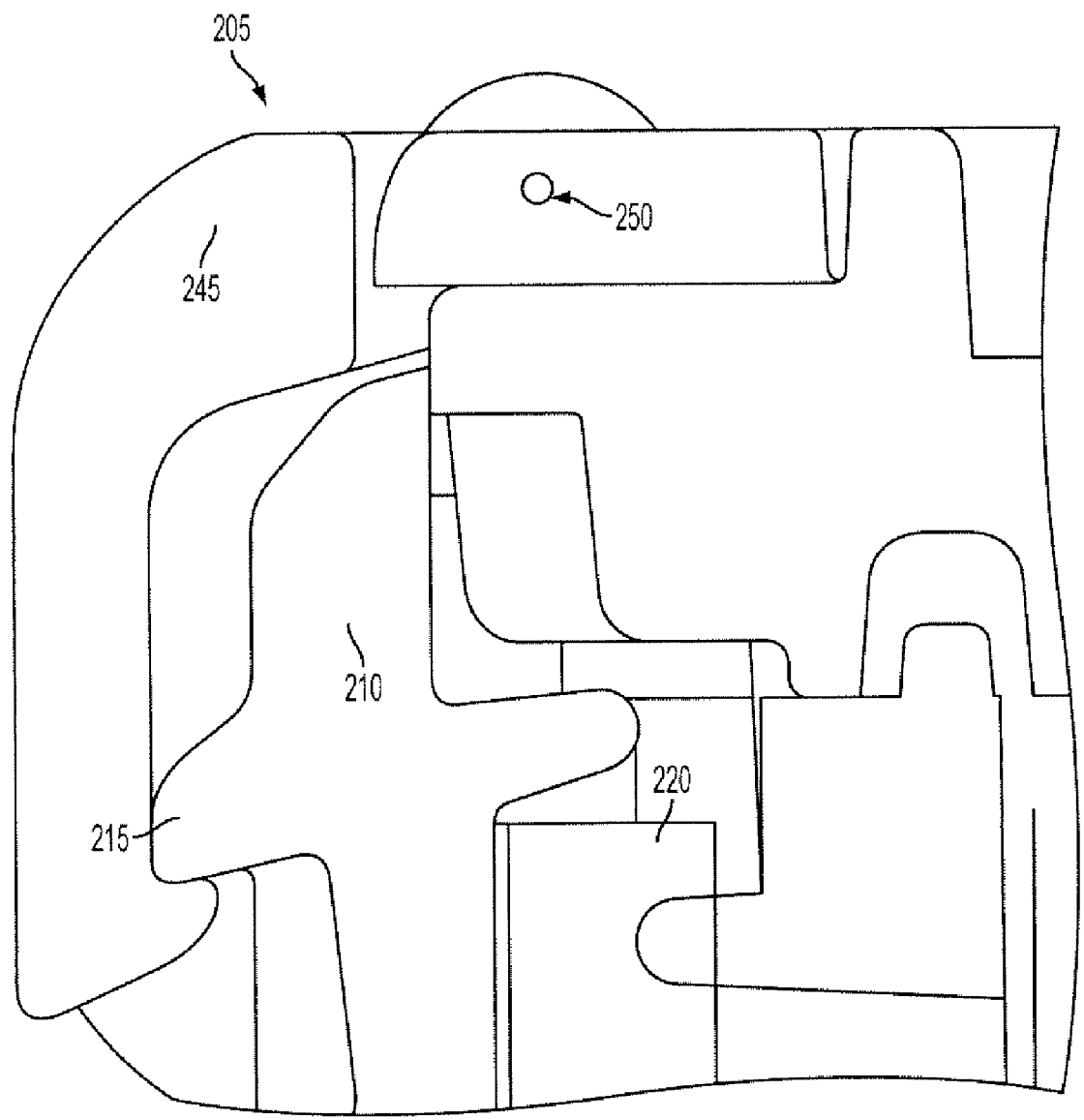
FIG. 2 is an illustration of a latch apparatus in a closed or locked position in accordance with exemplary embodiments.

FIG. 2 is an illustration of a latch apparatus 205 in a closed or locked position in accordance with exemplary embodiments. Latch apparatus 205 may include an oversnapping arm 245 which may be configured to rotate about a pivot portion 250. Latch apparatus 205 may also include an enclosure door 210. Enclosure door 210 may provide a seal for an enclosure when latch apparatus 205 is in the closed or locked position.

Latch apparatus 205 is shown in FIG. 2 in the closed or locked position. The oversnapping arm 245 has been snapped over the geometric mating feature 215 and is now geometrically interlocked with the geometric mating feature 215, resulting in a latched condition. That is, the feature portion of the oversnapping arm 245 has elastically deformed to hook into the geometric mating feature 215 on the enclosure door 210. In this condition, the oversnapping arm 245 may exert a positive pressure back against the enclosure door 210. The enclosure sealer 220 of the enclosure door 210 may thus form a tighter seal around the enclosure, whether the enclosure is empty or occupied.

Figure 3:
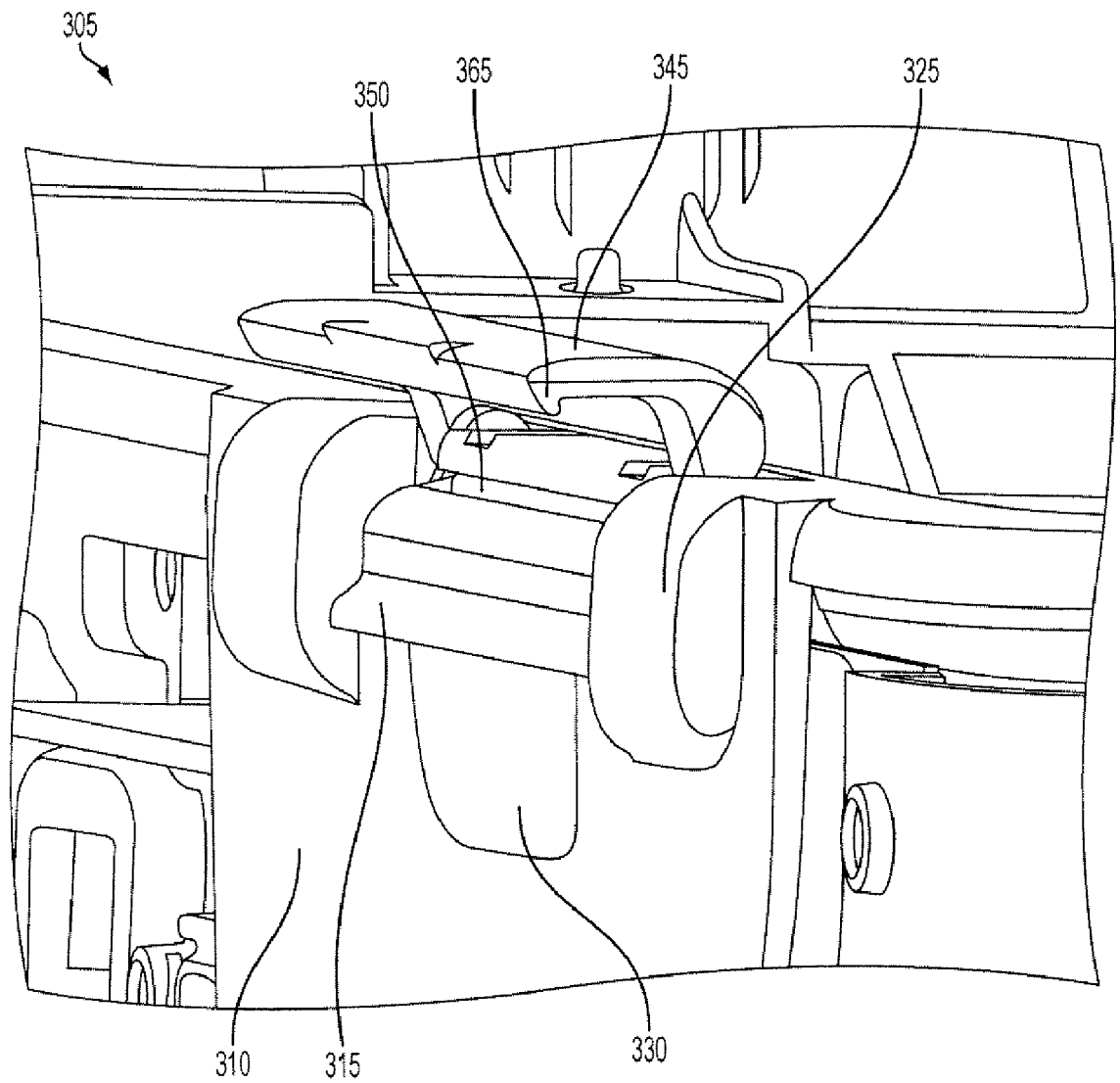
FIG. 3 is a right diagonal view of a latch apparatus in an open position in accordance with exemplary embodiments.

FIG. 3 is a right diagonal view of a latch apparatus in an open position in accordance with exemplary embodiments. Latch apparatus 305 is shown in an open position—meaning that the enclosure door 310 is not secured against the perimeter of the enclosure and the contents of the enclosure may be susceptible to damage from elements such as water or dust. Oversnapping arm 345 may be rotated 90° about pivot portion 350 to a full open position. The term "pivot portion" may refer to any axis about which the oversnapping arm 345 may pivot or rotate, whether such axis is a portion of the device or oversnapping arm, or is merely defined by the arm's rotational movement. Pivot portion 350 is not limited to a specific physical configuration.

Though not sealed securely against the enclosure area, enclosure door 310 may remain in contact position with the enclosure area. Although not illustrated in FIG. 3, enclosure door 310 may be configured to rotate or pivot about an axis at the bottom edge of the base unit. Enclosure door 310 may be configured to rotate back about the enclosure door pivot portion such that impact bumps 325 are resting on the surface on which the computing device is situated. Impact bumps 325 may be cast into the enclosure door and may protect the latch from opening after a jarring physical event such as a drop or other impact. Enclosure door 310 may also include geometric mating feature 315. An oversnapping arm 345 may be rotated downward about the pivot portion 350 and the geometric mating feature 315 may be configured to provide an impediment to the progress of the rotating arm. The geometric mating feature 315 may be configured such that further downward pressure on the oversnapping arm 345 may cause the oversnapping arm to elastically deform over the geometric mating feature 315. Further pressure may cause the oversnapping arm 345 to bend over the edge of the feature and then snap back in place over top of the geometric mating feature 315.

The oversnapping arm 345 may include a geometric mating ridge 365 that together with the geometric mating feature 315—causes the oversnapping arm 345 to be deflected over top of the geometric mating feature 315 in response to the application of a downward force.

The enclosure door 310 may further include recession area 330 under the geometric mating feature 315. The recession area 330 may allow for easier access to the oversnapping arm 345 for the purpose of opening up a closed latch.

Figure 4B:
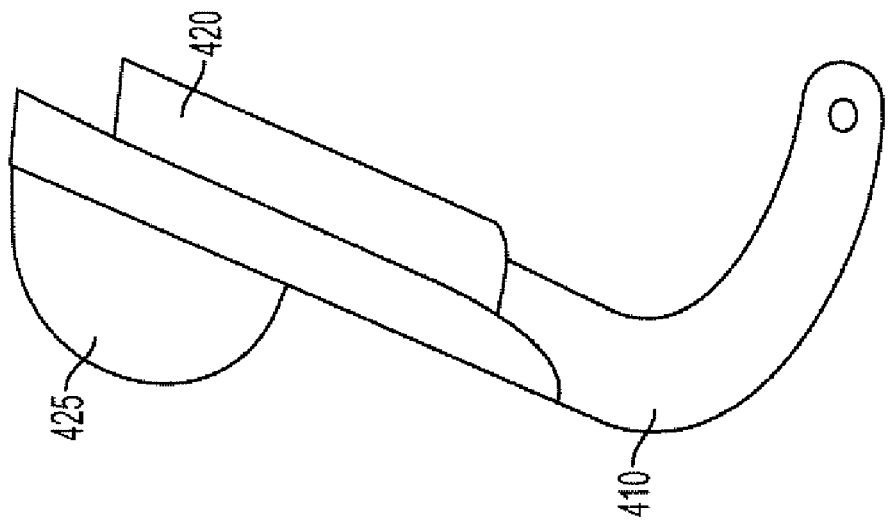
FIG. 4(b) is a profile of the enclosure door as seen from the right side and which includes an impact bump in accordance with exemplary embodiments.
Figure 4A:
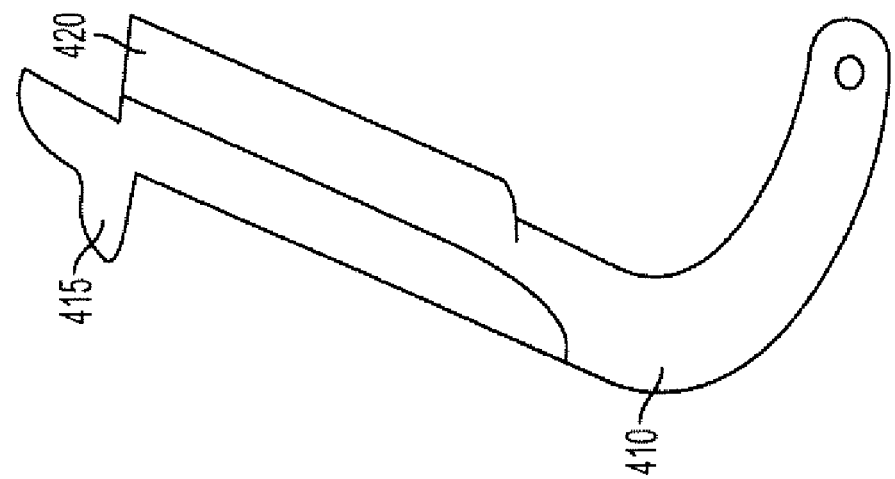
FIG. 4(a) is a cross section of the middle portion of an enclosure door, which includes a geometric mating feature in accordance with exemplary embodiments.

FIGS. 4(a) and 4(b) offer different views of an enclosure door 410. FIG. 4(a) is a cross section of the middle portion of an enclosure door 410, which includes a geometric mating feature 415 in accordance with exemplary embodiments. FIG. 4(b) is a profile of enclosure door 410 as seen from the right side and which includes an impact bump 425 in accordance with exemplary embodiments. Enclosure door 410 may be attached to the base unit of a personal computing device (which may be an instance of exemplary personal computing device 100 depicted in FIG. 1) in a manner such that enclosure door 410 can be rotated about an enclosure door pivot portion, such as the exemplary enclosure door pivot portion 535 shown in FIG. 5.

Enclosure door 410 may also include an enclosure sealer 420 for creating a substantially water-resistant and dust-resistant seal around the enclosure area (not pictured) The enclosure sealer 420 may extend the length of the enclosure door 410.

FIG. 4(a) is a cross section of the middle portion of the enclosure door 410 and thus shows the geometric mating feature 415 that an oversnapping arm 445 may be rotated over. FIG. 4(b) on the other hand, shows a view of the enclosure door 410 as it is seen from the right side. This view shows an impact bump 425. Also, the middle portion (illustrated in FIG. 4(a)) of the enclosure door 410 is shorter than the outer portion (illustrated in FIG. 4(b)). This may provide space for an oversnapping arm (not pictured) to rotate.

FIG. 5 is a right side diagonal view of a portable computing device 100 having a latch apparatus 505 in an open position in accordance with exemplary embodiments. Enclosure door 510 may be configured to rotate about an enclosure door pivot portion 535. With the enclosure door 510 fully opened, a peripheral device may be removed from or inserted into the exposed enclosure area or removed from the exposed enclosure area. Enclosure sealer 520 may be arranged on inside surface of the enclosure door 510 such that the sealing effect is optimized when the latch apparatus 505 is in the closed position. Optimum sealing may be achieved when the latch apparatus 505 is closed because a pressure is applied from the oversnapping arm 545 to the enclosure door 510 and a tighter, more effective seal may be created between the enclosure area 540 and enclosure sealer 520.

In some embodiments, the oversnapping arm 545 may be configured to rotate up to 90° about a pivot portion (exemplary pivot portions are variously depicted in FIGS. 2, 3, 7, 10, and 11). When the oversnapping arm 545 is in open position and rotated 90° away from the plane of the keyboard 170, a user may add or remove peripheral devices and the like from the exposed enclosure area 540.

Figure 6:
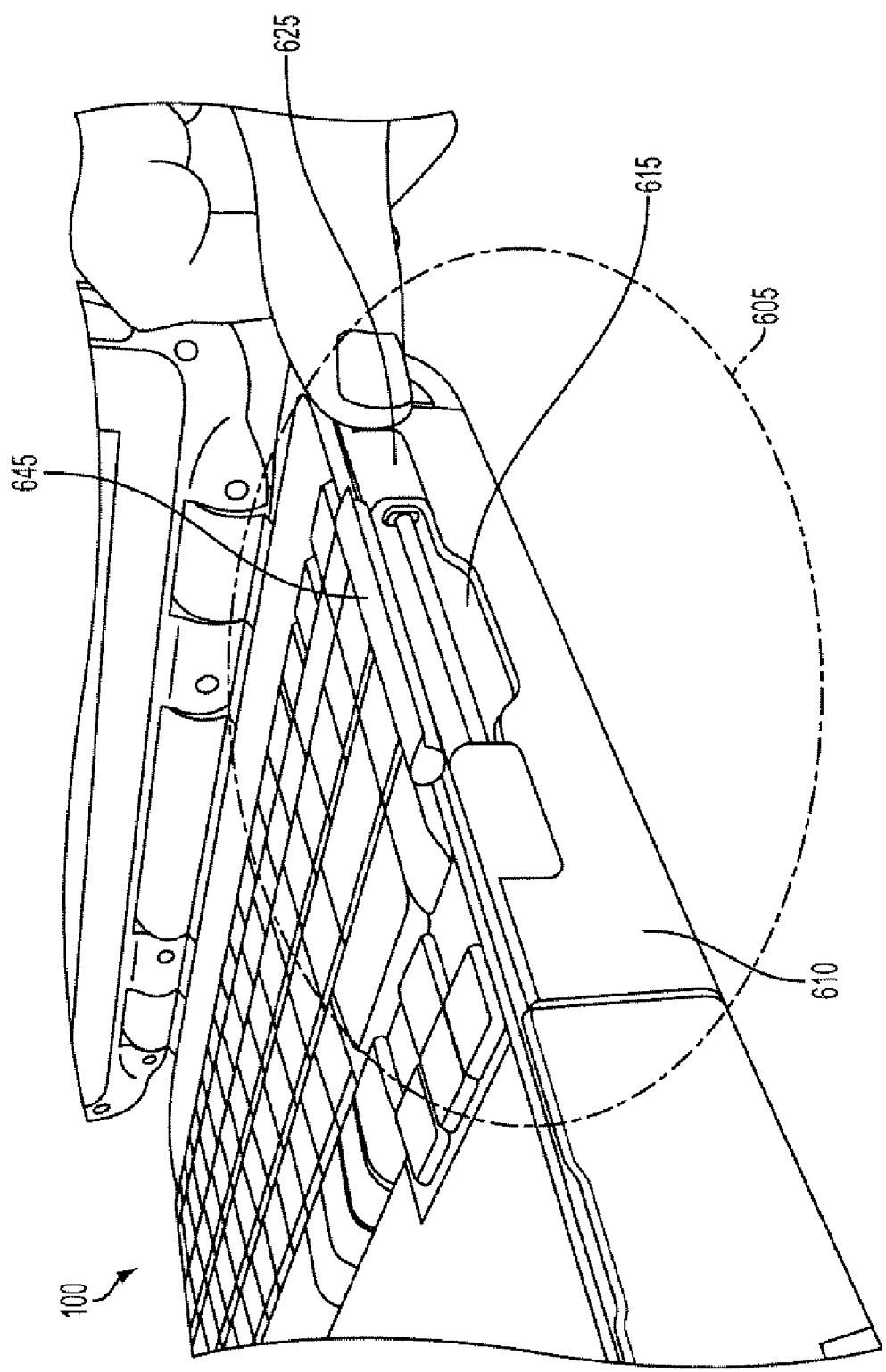
FIG. 6 is a right side diagonal view of a portable computing device having a latch apparatus with an enclosure door in the process of being closed in accordance with exemplary embodiments.

FIG. 6 is a right side diagonal view of a portable computing device 100 having a latch apparatus 605 with an enclosure door 610 in the process of being closed in accordance with exemplary embodiments. To close the latch apparatus 605, the enclosure door 610 may be rotated towards the enclosure area, such as, for example, exemplary enclosure area 540 depicted in FIG. 5. The impact bumps 625 may be used to push the enclosure door 610 to that area. The enclosure door 610 may be rotated until contact is made with any portion of the enclosure area. Once the enclosure door 610 has been rotated up to the enclosure area, the oversnapping arm 645 may be rotated so as to deform over the geometric mating feature 615 to close the latch apparatus 605.

Figure 7:
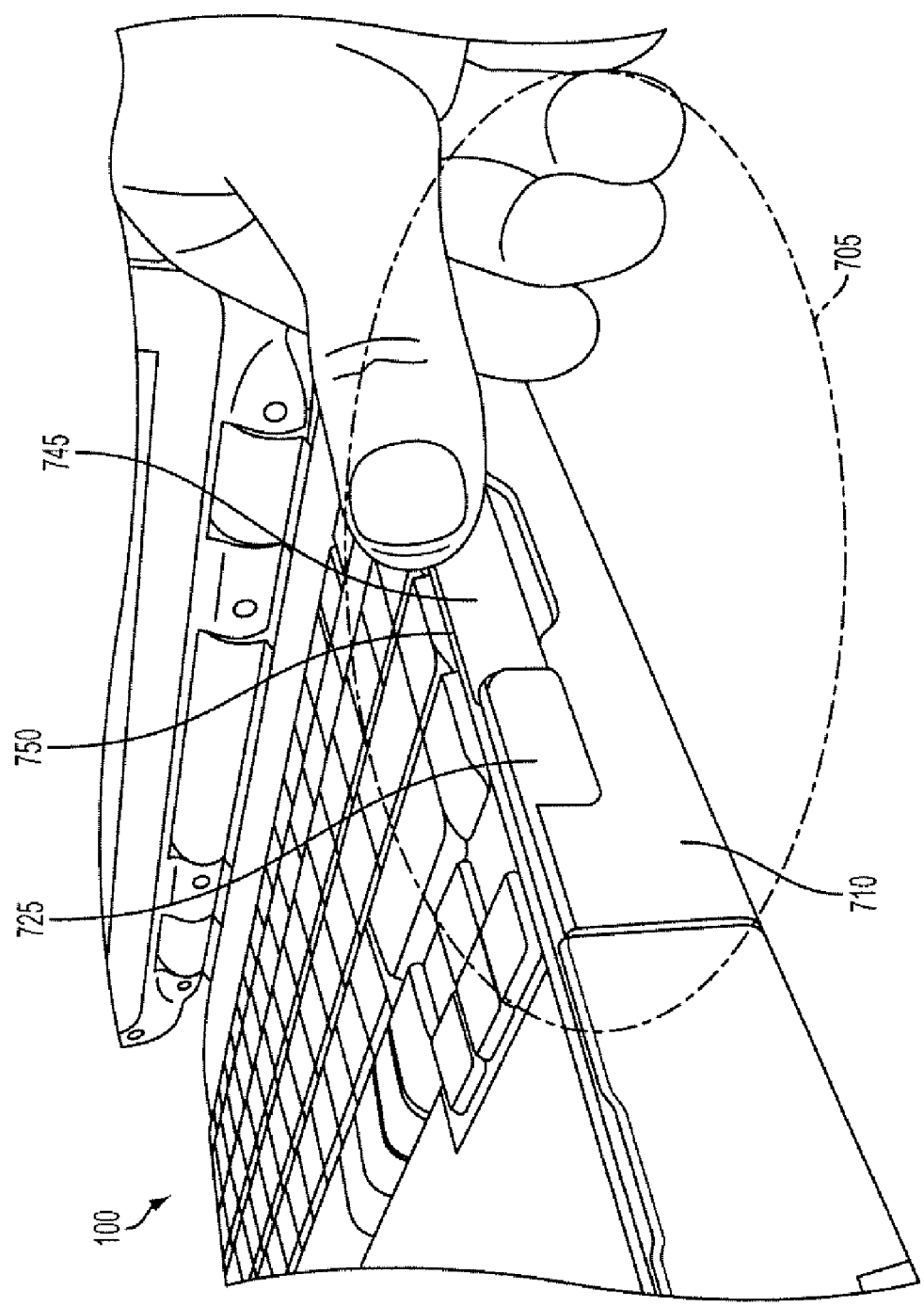
FIG. 7 is a right side diagonal view of a portable computing device having a latch apparatus with a oversnapping arm in the process of being snapped into a closed position in accordance with exemplary embodiments.

FIG. 7 is a right side diagonal view of a portable computing device 100 having a latch apparatus with an oversnapping arm 745 in the process of being snapped into a closed position in accordance with exemplary embodiments. The oversnapping arm 745 may be pushed inward or downward as illustrated in FIG. 7 and thus rotated about pivot portion 750. As the oversnapping arm 745 is forced downward, its progress will be impeded by a physical interference from the geometric mating feature (not pictured). Both the oversnapping arm 745 and the geometric mating feature are configured such that, when closed by a user, this physical interference causes a temporary deformation by the oversnapping arm such that it bends over the geometric mating feature and snaps back into place. The snap back in place may create an audible sound which can let the user know that the latch apparatus 705 is securely closed and that enclosure area is sealed from elements such as, for example, water and dust.

FIGS. 8(a)-8(e) are an illustration of an oversnapping arm 845 at various points as it is rotated about a rotation axis 850. The oversnapping arm 845 may include a geometric mating ridge 865 which fits over the geometric mating feature of an enclosure door (not pictured). As the oversnapping arm 845 is rotated downward, the geometric mating feature (as shown in FIG. 2, for example) may provide an impediment to the progress of the rotating arm. This impediment may cause the oversnapping arm to elastically deform over the geometric mating feature and snap into a locked position. Strengthening rib 890 may provide an added degree of stiffness to the oversnapping arm 845. Ergonomic protrusion 895 may be provided for ease in opening the latch.

Figure 8A:
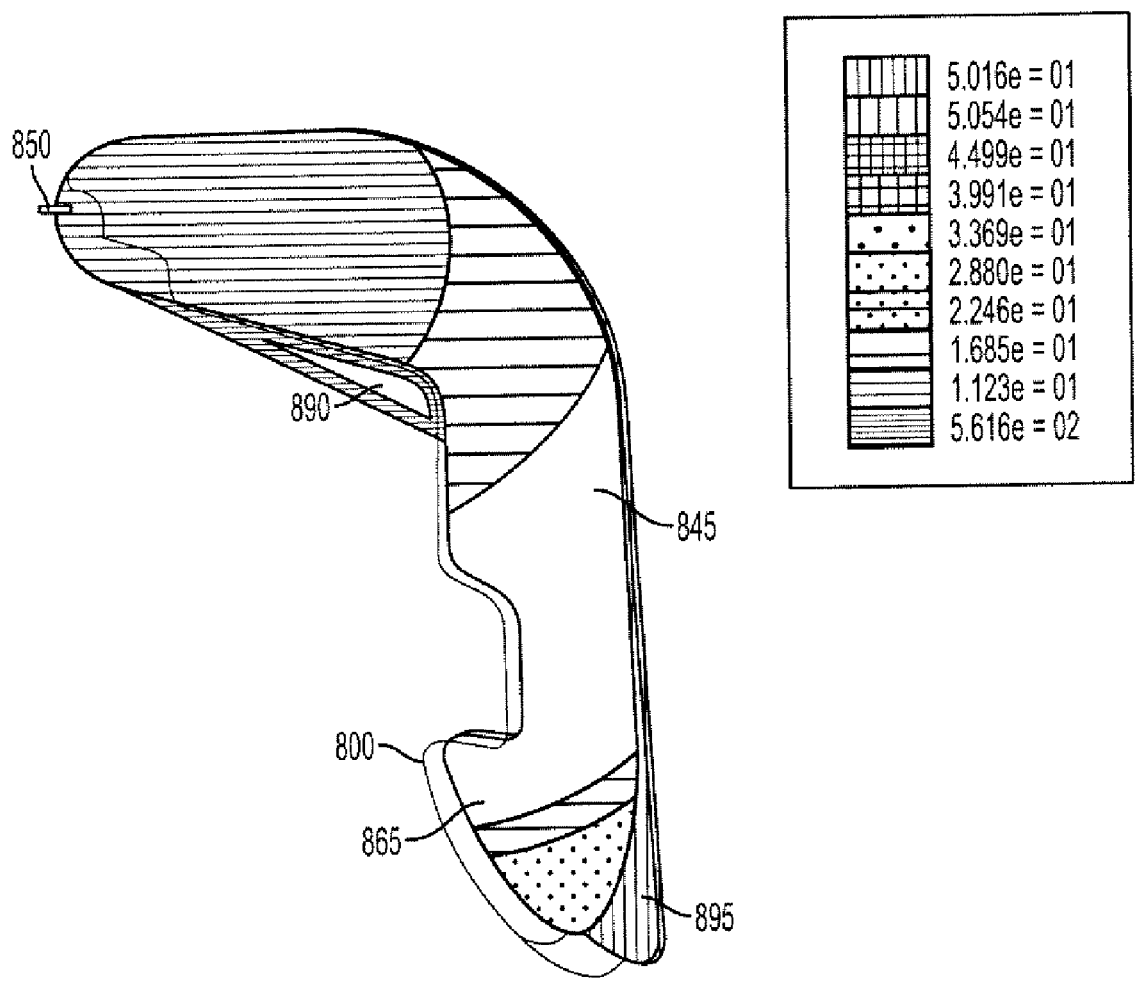
FIGS. 8(a)-8(e) are an illustration of an oversnapping arm at various points as it is rotated about a rotation axis in accordance with exemplary embodiments.
Figure 8B:
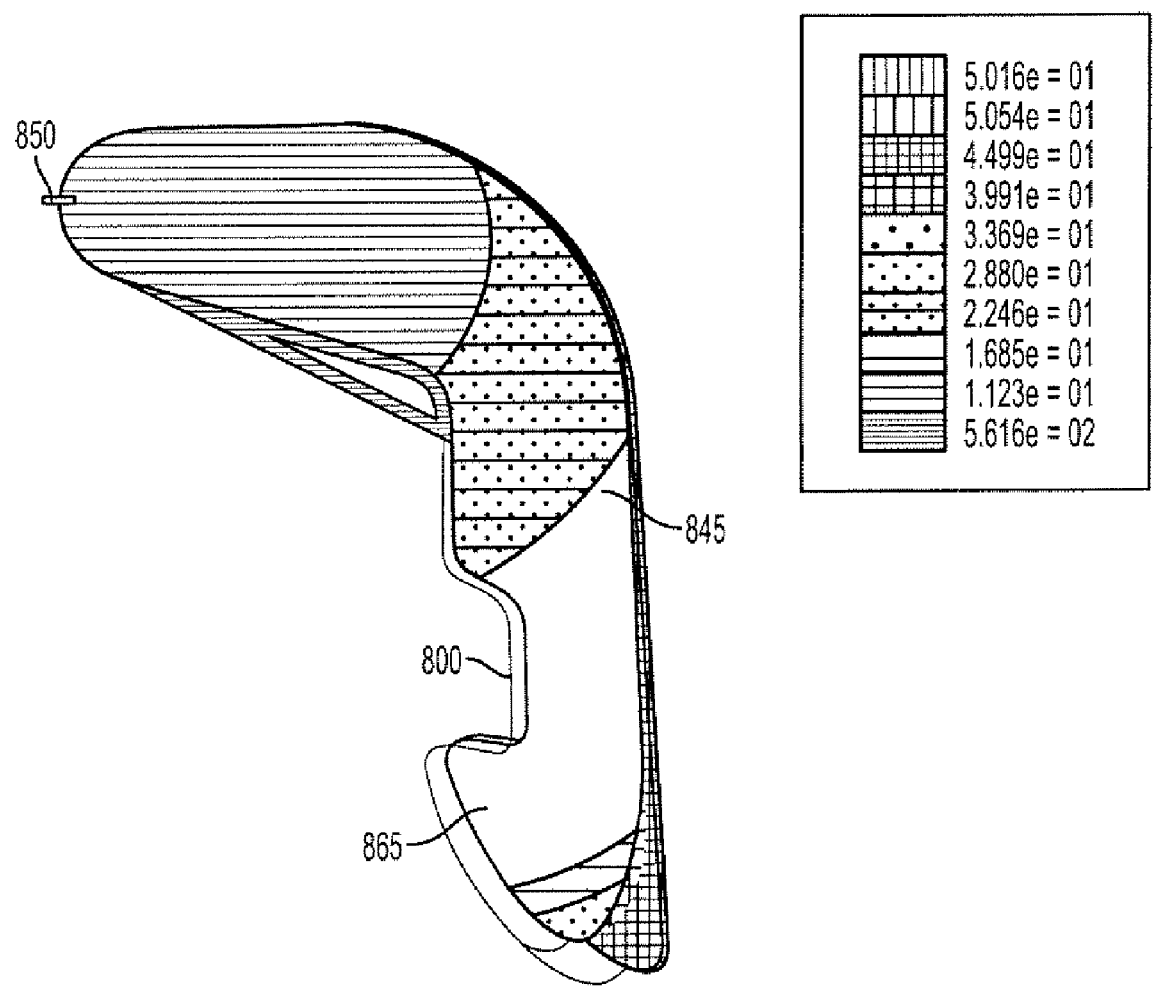
Figure 8C:
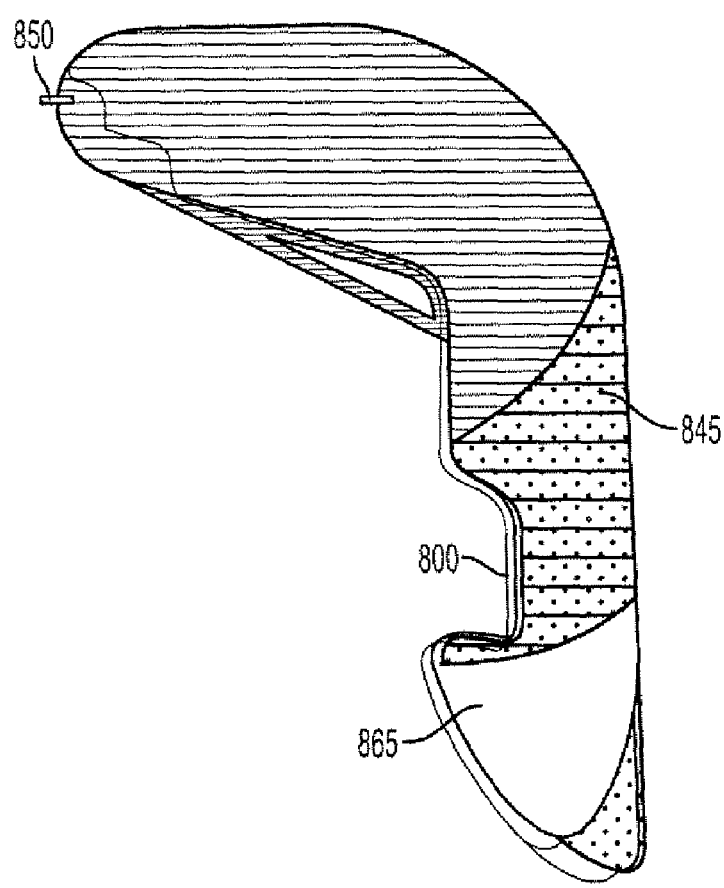
Figure 8D:
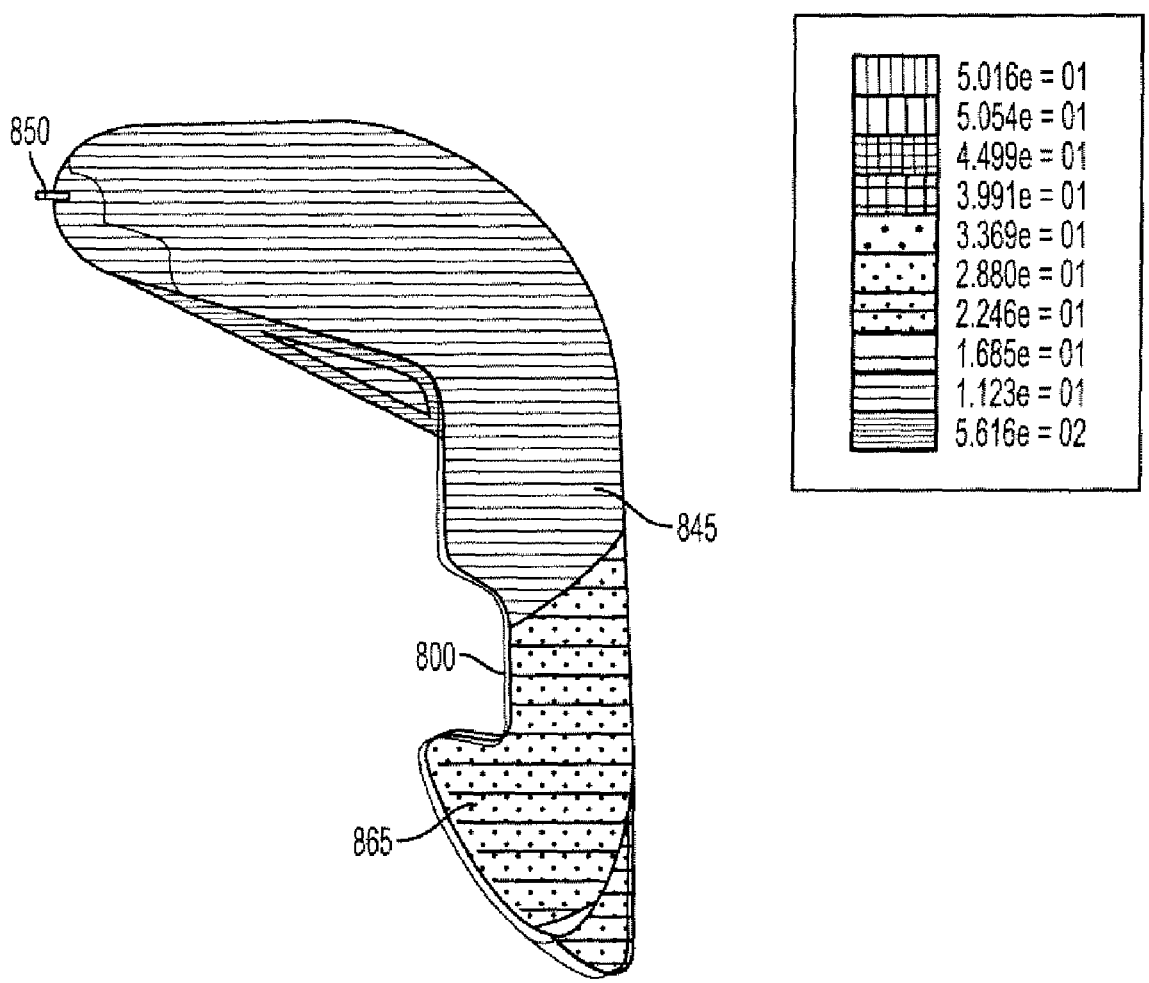
Figure 8E:
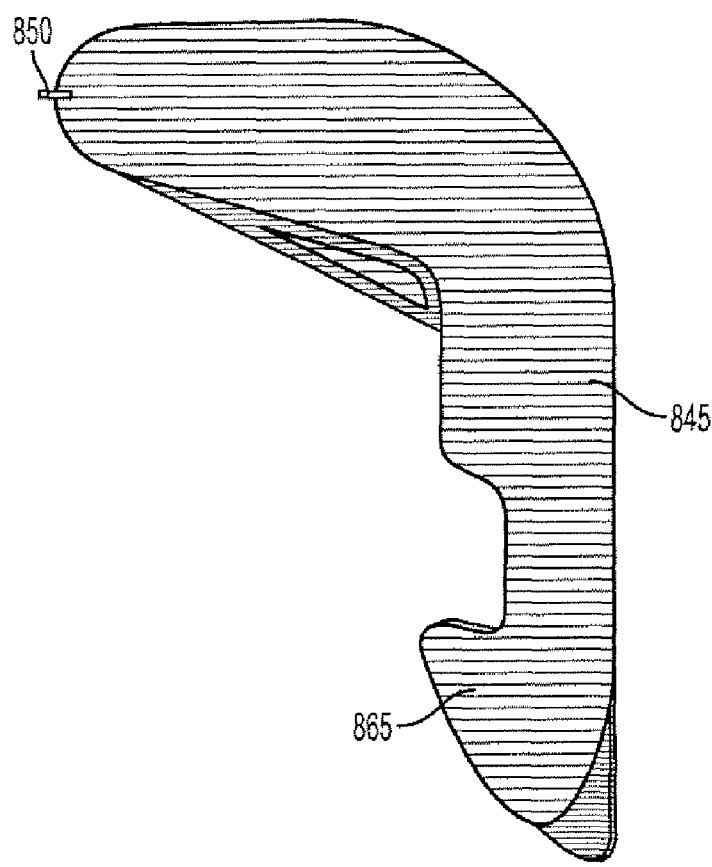

FIG. 8(a) shows the oversnapping arm 845 at its most deformed point. The outline 800 represents the position of the oversnapping arm 845 in the closed or locked position. FIG. 8(e) shows the oversnapping arm 845 in the locked position which corresponds to the outline 800. FIGS. 8(b), 8(c), and 8(d) show the oversnapping arm 845 as it is being rotated from the most deformed point (illustrated in FIG. 8(a)) to the closed position shown in FIG. 8(e).

Figure 9:
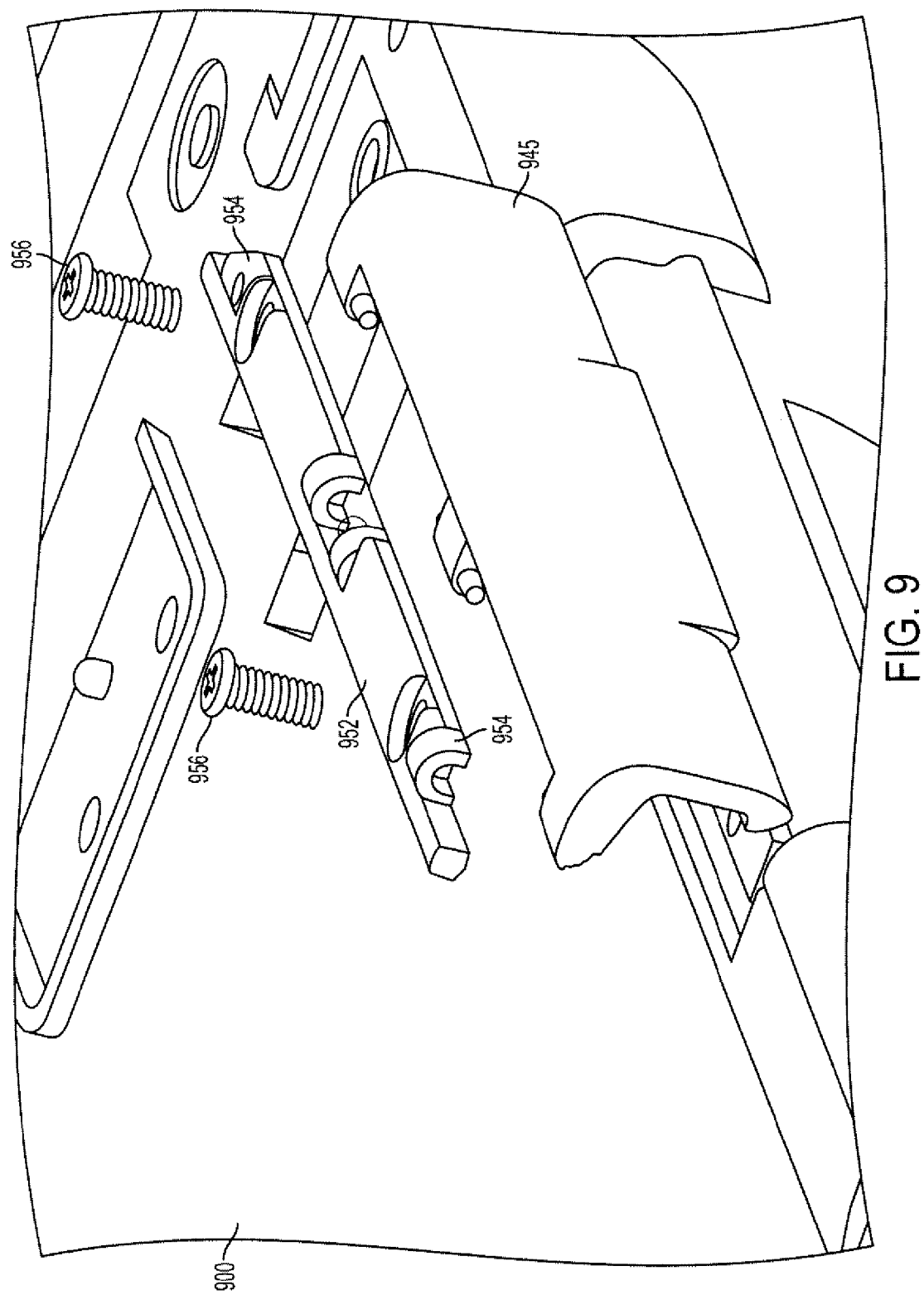
FIG. 9 is an illustration of a bracket for securing an oversnapping arm to a portable computing device in accordance with exemplary embodiments.

FIG. 9 is an illustration of a bracket 952 for securing an oversnapping arm 945 to a portable computing device 900 in accordance with exemplary embodiments. In some embodiments, a pivot portion of latch apparatus may include a bracket 952 for securing an oversnapping arm 945 to a portable computing device 900. The oversnapping arm 945 may rotate in the bracket 952. Bracket 952 may include one or more bump interferences 954 which may prevent the oversnapping arm 945 from unintentionally falling out of a fully open position. Keeping the oversnapping arm in the fully open position (as is depicted, for example, in FIGS. 3, 5, 6, and 11) may prevent the oversnapping arm 945 from interfering with devices being inserted to or removed from an enclosure area. The bracket may further enhance ease of use when the user is closing the door. Rather than lifting up the oversnapping arm 945, closing the enclosure door, and snapping down the oversnapping arm 945, the user may secure the latch with only the latter two steps.

Bracket 952 may be secured to a portable computing device 900 with one or more fasteners 956. The fastener depicted in FIG. 9 is purely exemplary and non-limiting. In some embodiments, bracket 952 may be permanently attached to a portable computing device 900 or cast as part of the same. In some embodiments, bracket 952 may be permanently or removably attached to a portable computing device 900 without the use of a fastener.

Figure 10B:
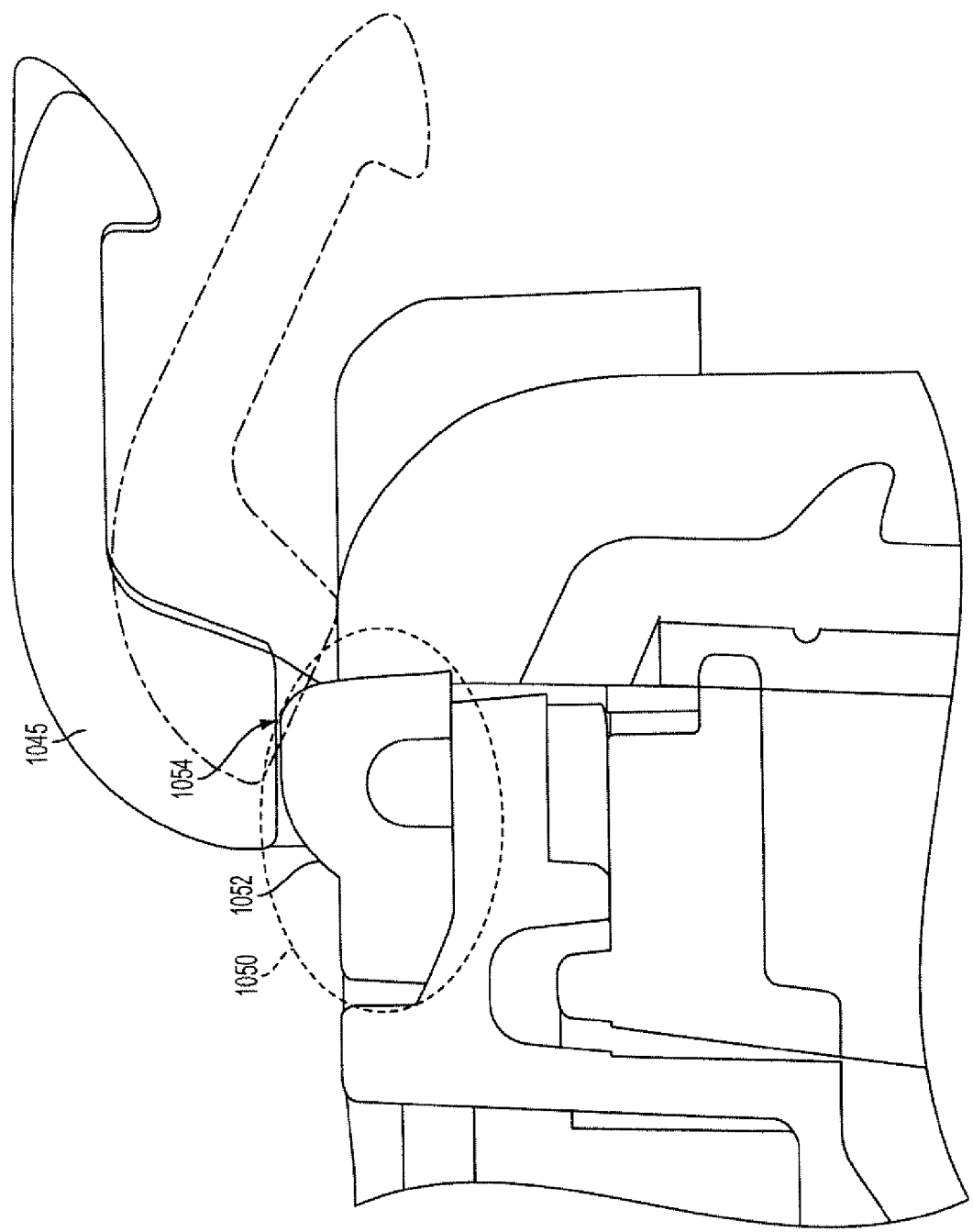
FIG. 10(b) is a side view of an oversnapping arm held in an open position by a bump interference in accordance with exemplary embodiments.

FIGS. 10(*a*) and 10(*b*) are side views of an oversnapping arm 1045 as it rotates over a bump interference 1054 and into a fully open position. Pivot portion 1050 may include a bracket 1052 with a bump interference 1054. Bump interference 1054 may physically interfere with an oversnapping arm 1045 as it is rotated into a fully open position. After the oversnapping arm 1045 rotates over the bump interference 1054, the bump interference 1054 may act as a physical barrier which may prevent the oversnapping arm 1045 from unintentionally falling out of a fully open position.

Various figures (e.g. FIG. 1) depict a portable computing device as a "laptop" or "notebook" computer. However, it should be appreciated that the various embodiments described throughout this specification are not limited to a laptop or notebook computer and are usable on any computing device, such as, by way of non-limiting example, a desktop computer, personal digital assistant or other handheld computing device. Such computing devices may include a keyboard module, a display module, and/or a processing module. These modules may be operatively coupled with one another on a computing device. The latch apparatus described throughout the disclosure may securely close and seal any such computing device or component of a computing device. In some embodiments, the latch apparatus described herein may be used to close and seal containers for sensitive electronic equipment, ammunition, or medical supplies.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A latch apparatus for securing a door on a portable computing device, the latch apparatus comprising:

an oversnapping arm configured to rotate about a pivot portion; and an enclosure door comprising an inside surface, an outside surface, a geometric mating feature on the outside surface, and an enclosure sealer on the inside surface, wherein the geometric mating feature is configured to present a physical interference to the oversnapping arm when the oversnapping arm rotates in the direction of the enclosure door;

wherein the oversnapping arm is configured to elastically deform around the physically interfering geometric mating feature when sufficient force is applied to the oversnapping arm in the rotation direction toward the enclosure door;

whereby the oversnapping arm is deflected over the geometric mating feature and snaps into a stable, geometrically interlocked position with the geometric mating feature.

2. The latch apparatus of claim 1, wherein, when the oversnapping arm is in the interlocked position, the enclosure sealer is configured to contact the enclosure area, and whereby a water-resistant and dust-resistant seal is created.

3. The latch apparatus of claim 2, wherein the geometrically interlocked oversnapping arm, when in the interlocked position, applies a positive pressure against the enclosure door; and wherein the positive pressure against the enclosure door results in sustained pressure on the seal.

4. The latch apparatus of claim 1 wherein the enclosure door and the oversnapping arm are made of different materials.

5. The latch apparatus of claim 1, wherein the oversnapping arm is configured to create an audible sound upon snapping into place.

6. The latch apparatus of claim 1 wherein the oversnapping arm is configured to rotate up to 90% about the pivot portion.

7. The latch apparatus of claim 1 wherein the latch apparatus does not comprise a metal spring.

8. The latch apparatus of claim 1, wherein the oversnapping arm is a thermoplastic material.

9. The latch apparatus of claim 1, wherein the enclosure door is made of a material selected from the group consisting of: an aluminum alloy and a magnesium alloy.

10. A portable computing device comprising:

a base unit comprising a processor;

a display panel coupled to the base unit;

an apparatus for securing a door comprising:

a pivot portion coupled to the base unit of a portable computing device;

an oversnapping arm configured to rotate about the pivot portion; and an enclosure door comprising an inside surface, an outside surface, a geometric mating feature on the outside surface and an enclosure sealer on the inside surface, wherein the geometric mating feature is configured to present a physical interference to the oversnapping arm when the oversnapping arm is rotated in the direction of the enclosure door;

wherein the oversnapping arm is configured to bend around the physically interfering geometric mating feature when sufficient force is applied to the oversnapping arm in the rotation direction toward the enclosure door;

whereby the oversnapping arm is deflected over the geometric mating feature and snaps into a stable, geometrically interlocked position with the geometric mating feature.

11. The portable computing device of claim 10, wherein, when the oversnapping arm is in the interlocked position, the enclosure sealer is configured to contact the enclosure area, and whereby a water-resistant and dust-resistant seal is created;
   wherein the geometrically interlocked oversnapping arm is configured, when the oversnapping arm is in the interlocked position, to apply a positive pressure against the enclosure door;
   wherein the positive pressure against the enclosure door results in sustained pressure on the seal.

12. The portable computing device of claim 10, wherein the oversnapping arm is configured to create an audible sound upon snapping into place.

13. The portable computing device of claim 10 wherein the latch apparatus does not comprise a metal spring.

14. An apparatus for sealing a door on a portable computing device, comprising:
   oversnapping means for snapping over an interfering feature;
   an arm interference means for deflecting the progress of a rotating arm;
   an enclosure sealer for creating a water and dust resistant seal around an enclosure; and
   a seal tightening means for applying positive pressure on the card enclosure sealer.

* * * * *